United States Patent
Barone et al.

[11] Patent Number: 6,020,632
[45] Date of Patent: Feb. 1, 2000

[54] ELECTRONIC COMPONENT INCLUDING AN ADJUSTABLE CAP

[75] Inventors: Terry D. Barone, Mesa; Daniel P. Saunders, Glendale, both of Ariz.

[73] Assignee: Motorola, Inc., Schaumburg, Ill.

[21] Appl. No.: 08/806,815

[22] Filed: Feb. 26, 1997

[51] Int. Cl.[7] .................. H01L 31/0203; H01L 23/12
[52] U.S. Cl. .................. 257/704; 257/434; 372/43
[58] Field of Search .................. 257/99, 433, 4, 257/98; 372/36, 43

[56] References Cited

U.S. PATENT DOCUMENTS

| | | | |
|---|---|---|---|
| 3,855,606 | 12/1974 | Schoberl | 257/99 |
| 4,054,814 | 10/1977 | Fegley et al. | 315/71 |
| 4,281,993 | 8/1981 | Shaw | 434/22 |
| 4,878,107 | 10/1989 | Hopper | 257/99 |
| 5,068,866 | 11/1991 | Wada et al. | 372/36 |
| 5,296,724 | 3/1994 | Ogata et al. | 257/98 |
| 5,340,993 | 8/1994 | Salina et al. | 250/551 |
| 5,808,325 | 9/1998 | Webb | 257/99 |
| 5,825,054 | 10/1998 | Lee et al. | 257/98 |
| 5,878,069 | 3/1999 | Kamibayashi et al. | 372/36 |

*Primary Examiner*—Teresa M. Arroyo
*Attorney, Agent, or Firm*—Daniel R. Collopy; Lanny L. Parker

[57] ABSTRACT

An electronic component (10) is formed by placing a cap (30) over a light generating device (16). The cap (30) has a top portion (32) that provides a lens (33). The lens (33) is transparent to the optical signal generated by the light generating device (16). The optical characteristics of the electronic component (10) can be adjusted by varying the relative position of the cap (30) over the light generating device (16).

22 Claims, 2 Drawing Sheets

ELECTRONIC COMPONENT INCLUDING AN ADJUSTABLE CAP

BACKGROUND OF THE INVENTION

The present invention relates, in general, to electronic components, and more particularly, to electronic components that place a lens at a fixed distance from an optical device.

Vertical cavity surface emitting lasers (VCSELs) are one type of optical device that is widely used in the electronics industry. A VCSEL is a semiconductor device that generates light at a particular wavelength or a band of wavelengths when the VCSEL is in operation (i.e., electrically active). This type of optical device is typically mounted into a package that is commonly referred to as a "metal can" to protect the VCSEL. This nomenclature comes from the fact that VCSEL devices are frequently encapsulated in an Kovar/mild steel cap that has a lens opposite the VCSEL. As an example, one type of "metal can" package used in the industry is the TO-56 package. The specifications of TO-56 and similar packages are defined for the electronic industry by the Joint Electronics Design Engineering Council (JDEC).

"Metal can" packages are both an expensive and sometimes unreliable method for packaging optical devices. In particular, the "metal can" is formed by shaping Kovar/mild steel into a cap shape and then an optical lens is mounted to the cap. This process is very time consuming and represents a significant portion of the manufacturing cost of optical devices. In addition, the exact alignment of the lens relative to the VCSEL is critical in determining the performance of the optical component.

Accordingly, a need exists to package electronic components such as optical devices that is both less expensive and more reliable than existing "metal can" packages.

Figure 1:
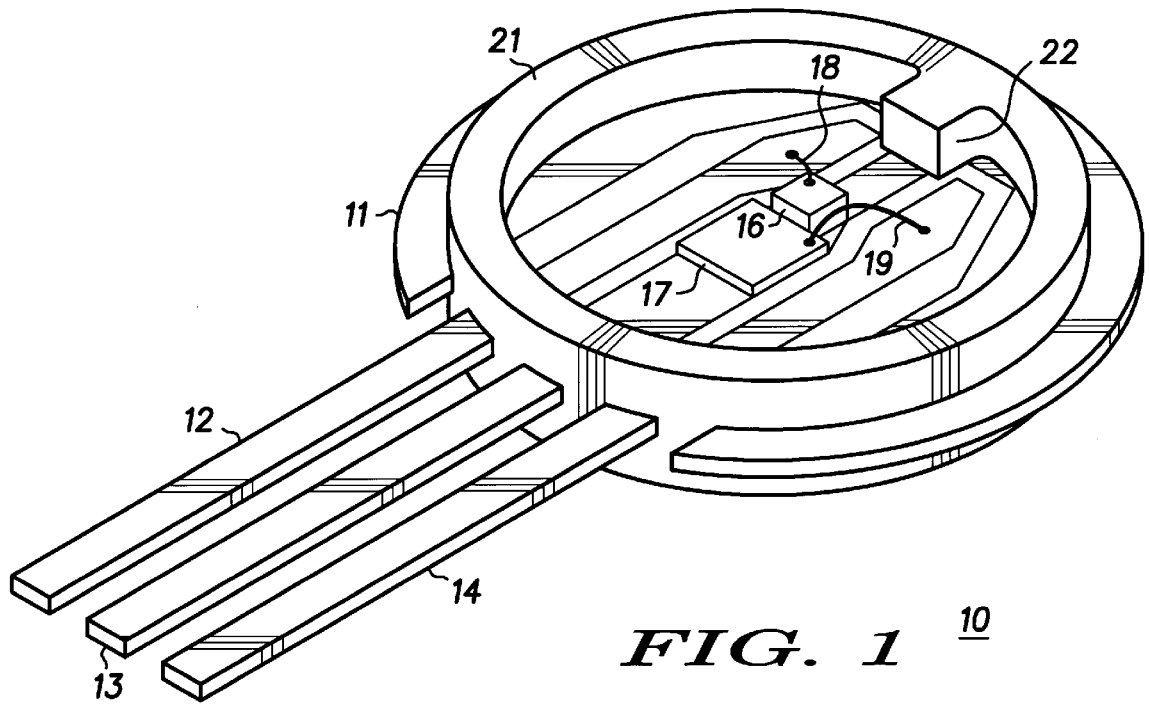
FIG. 1 is an enlarged isometric view of a portion of an electronic component in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

In general, the present invention provides a method for forming a package that can be used to encapsulate optical devices such as VCSELs, light emitting diodes (LEDs), or similar semiconductor devices to form electronic components. In essence, the present invention obviates the need to form "metal cans" to package optical components. Instead of forming a "metal can" and a separate lens over an optical device, the present invention forms a cap from a non-conductive and transparent compound. The cap is formed in a mold process so that a lens is integrated into the cap.

In addition, the present invention provides a method for adjusting the placement of the cap relative to the semiconductor device encased within the cap to tune the optical properties of the electronic component. This adjustment process adds flexibility to the manufacturing of the electronic component so that the specific needs of an individual customer can be met. It should also be understood that the examples provided below are not intended to suggest that the present invention is only applicable to electronic components that generate or detect optical signals. The features of the present invention may also be beneficial to encapsulate semiconductor devices that are used in other applications.

FIG. 1 is an enlarged isometric view of an electronic component 10 at an early step in the manufacturing process. In the preferred embodiment of the present invention, electronic component 10 is formed using a leadframe 11 that has a plurality of leads 12–14. In other applications, leadframe 11 may be replaced with a substrate such as a printed circuit board (PCB), ceramic substrate, or the like.

A ring 21 is formed on leadframe 11 using one of a variety of techniques such as a conventional mold injection process, a transfer mold process, or by attaching a pre-formed ring to leadframe 11. As will be explained in more detail below, ring 21 is used to align the position of a lens (not shown) relative to leadframe 11. To facilitate this alignment process, ring 21 is formed with an alignment guide 22.

In this example, electronic component 10 is an optical device that employs the use of two semiconductor devices, namely a light generating device 16 and a light detecting device 17. Light generating device 16 can be one of many devices such as a VCSEL, an LED, or other device that generates electromagnetic radiation when in operation (i.e., electrically active). Light generating device 16 need not generate electromagnetic radiation that is within the visible light spectrum as both an infrared or ultraviolet device could also be used in this example.

Light detecting device 17 is used to monitor and control the amount of light that is produced by light generating device 16. For example, light detecting device 17 can be a photodetector or a photocell that generates a proportional voltage or current signal in response to the amount of light that is emitted by light generating device 16. As shown in FIG. 1, light generating device 16 and light detecting device 17 are attached to leadframe 11 and bonding wires 18 and 19 are used to electrically couple light generating device 16 and light detecting device 17 to leads 12 and 14, respectively.

Figure 2:
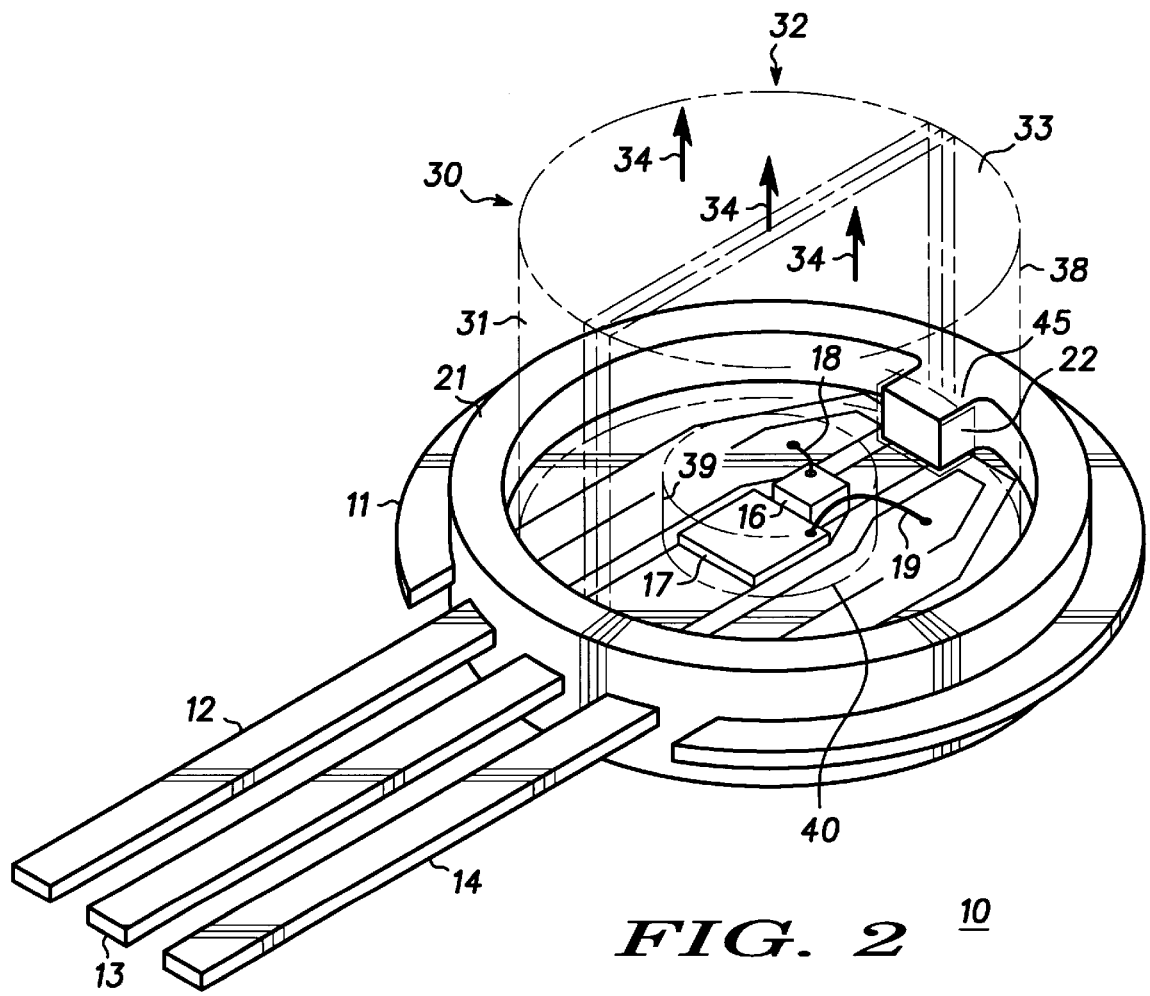
FIG. 2 is an enlarged isometric view of the electronic component in accordance with the present invention.

FIG. 2 is an enlarged isometric view of electronic component 10 after further processing. A cap 30 is formed from a non-conductive and transparent mold compound and attached to ring 21. Cap 30 provides the necessary encapsulation and protection of light generating device 16 and light detecting device 17 without interfering with the optical performance of electronic component 10. Cap 30 has a top portion 32 that is supported by and made from the same material as sidewalls 31. The top portion 32 of cap 30 acts as a lens 33 that is used to control or tune the optical signals generated by electronic component 10. Since the top portion 32 of cap 30 is made from a transparent material, the optical signals generated by electronic component 10 can pass through lens 33. The optical signal generated by electronic component 10 is indicated in FIG. 2 with arrows 34.

Figure 3:
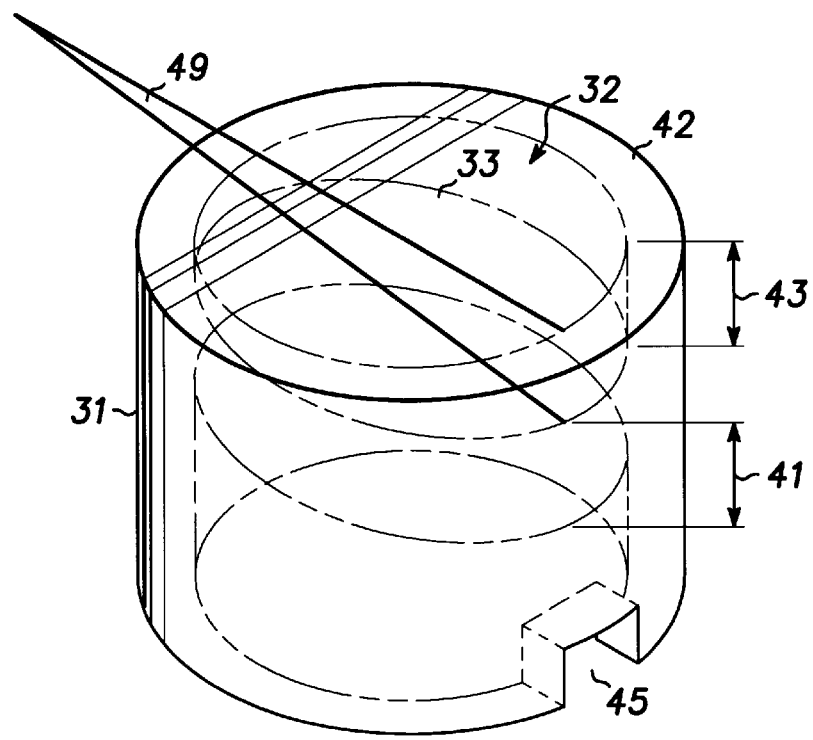
FIG. 3 is an enlarged isometric view of a portion of the electronic component in accordance with an alternate embodiment of the present invention.

The sidewalls 31 of cap 30 also provide a cavity 40 that preferably extends at least 0.25 millimeters above light generating device 16 and light detecting device 17. Cavity 40 is used to ensure that cap 30 does not physically damage light generating device 16 and light detecting device 17 during assembly. The configuration of cavity 40 can be altered to adjust the placement of lens 33 relative to light generating device 16 and light detecting device 17. As shown in FIG. 3, cap 30 also has an indented portion or a groove 45 that is used to align the placement of cap 30 relative to alignment guide 22 on ring 21.

In the preferred embodiment, the position of cap 30 relative to ring 21 is adjusted to tune the performance of electronic component 10. Raising or lowering the position of cap 30 also adjusts the relative position of lens 33 over light generating device 16 and light detecting device 17. This in turn varies the focal point of the optical signal (arrows 34) generated by electronic component 10. For example, raising the height of cap 30 by 1 mil (approximately 25 microns) can vary the distance of the focal point of the optical signal emitted by electronic component by several millimeters. The focal point is the distance from lens 33 where the optical signal is in focus. This distance depends on the configuration of cavity 40, the thickness and optical properties of lens 33, and the wavelength of the optical signal generated by light generating device 16.

Cap 30 is formed using a transfer mold process or an injection mold process. The formation of cap 30 involves forming a mold (not shown) that provides the shape for cap 30 such as is shown in FIG. 3. The mold is then placed in a chamber in a mold press (not shown) and the transparent material used to form cap 30 is injected into the chamber. A variety of materials can be used to form cap 30, which can be generally described as clear epoxy resins or thermal plastic. Some examples of such materials include "Nitto NT300" or "Nitto NT 510," which are registered trademarks of Nitto Electric Industrial Co., LTD. of Osaka, Japan, or "Dexter Hysol M018", which is a registered trademark of Dexter of Industry, California.

It should also be understood that the optical properties of electronic component 10 can be adjusted by coating the outer surface 38 or inner surface 39 of cap 30 with a reflective or holographic material (not shown). The electrical properties of electronic component 10 can be adjusted by coating the outer surface 38 or inner surface 39 of cap 30 with a conductive material (not shown). This may be desirable to ground or to place a voltage potential on cap 30 when electronic component 10 is in operation.

Turning now to FIG. 3, an alternate method of forming cap 30 in accordance with the present invention is provided. The mold used to pattern cap 30 can be modified so that cap 30 is formed with a lens protector 42. Lens protector 42 is a part of the top portion 32 of cap 30 that extends above lens 33. This helps prevent lens 33 from becoming scratched during the assembly or operation of electronic component 10. Preferably, lens protector 42 extends above lens 33 a distance ranging from about 0.1 millimeters to 20 millimeters. This distance is indicated in FIG. 3 by an arrow 43.

As mentioned above, it is possible to adjust the optical characteristics of electronic component 10 by varying the thickness of lens 33 (indicated by an arrow 41). Preferably, the thickness of lens 33 ranges from about 0.1 millimeters to 20 millimeters. It is also possible to shape the mold used to form cap 30 so that lens 33 is at an angle 49 relative to underlying semiconductor devices (see FIG. 2). By forming lens 33 at an angle, it is possible to adjust the optical characteristics of electronic component 10 by rotating cap 30 relative to ring 21 (see FIG. 2).

Figure 4:
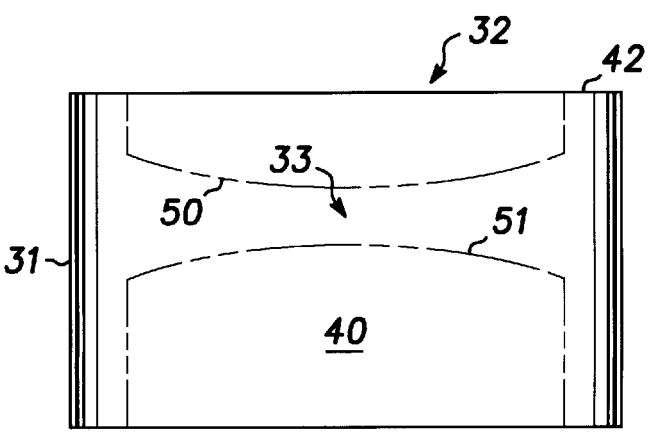
FIG. 4 is an enlarged cross-sectional view of a portion of the electronic component in accordance with an alternate embodiment of the present invention.

FIG. 4 is an enlarged cross-sectional view of cap 30 and is provided to illustrate yet another way of varying the optical characteristics of electronic component 10 (see FIG. 1). By adjusting the shape of the mold used to form cap 30, it is possible to shape lens 33 so that it is convex or concave. As shown in FIG. 4, lens 33 has an upper surface 50 that is concave and a lower surface 51 that is convex. It should also be understood that it is possible to form cap 30 so that only one of upper surface 50 or lower surface 51 is concave or convex, or so that both surfaces 50 and 51 are convex or concave.

In FIG. 3, cap 30 is shown to have a cylindrical shape and top portion 32 of cap 30 is relatively flat. This is only intended as one possible example of the present invention and it should be understood that other configurations such as square or rectangular shape are possible depending on the particular application of electronic component 10. The use of ring 21, alignment guide 22, and groove 45 are not required and should be considered optional.

The process described hereinabove, provides a method of encapsulating an electronic component that generates an optical signal. The present invention forms a cap that integrates a lens into the package. This obviates the need to attach a separate lens to a "metal can" package as is currently done in the art. The present invention also provides a method for adjusting or tuning the optical characteristics of the electronic component during the assembly process. These advantages not only reduce the manufacturing cost of the electronic component, but add flexibility in meeting varying customer demands as well.

We claim:

1. An electronic component comprising:
   a leadframe;
   a ring overlying the leadframe:
   a first semiconductor device coupled to the leadframe; and
   a cap having sidewalls coupled to the ring and formed from a non-conductive material, wherein the cap provides a cavity that is adjustably positioned for overlying the first semiconductor device, and the cap has a top portion that is transparent to light generated by the first semiconductor device, the cap and the top portion being made from a continuous portion of the non-conductive material.

2. The electronic component of claim 1 wherein the ring has an alignment guide, the cap has a groove, and the cap is adjustably positioned over the first semiconductor device by aligning the groove of the cap to the alignment guide of the ring.

3. The electronic component of claim 1 wherein the cap is adjustably positioned so that light generated by the first electronic component has a focal point that is at a first distance from the top portion of the cap.

4. The electronic component of claim 3 wherein the first distance is about 0.1 millimeter to 100 millimeters.

5. The electronic component of claim 1 wherein the top portion of the cap has a surface that is convex.

6. The electronic component of claim 1 wherein the top portion of the cap has a surface that is concave.

7. The electronic component of claim 1 wherein the top portion of the cap has an upper surface that is concave and a lower surface that is convex.

8. The electronic component of claim 1 wherein the top portion of the cap has an upper surface and a portion of the cap extends a greater distance above the first semiconductor device than the upper surface.

9. The electronic component of claim 1 wherein the cavity of the cap extends at least 0.25 millimeters above the first semiconductor device.

10. The electronic component of claim 1 further comprising a second semiconductor device, wherein the second semiconductor device detects light when the first electronic component is electrically active.

11. The electronic component of claim 1 wherein the non-conductive material is an epoxy resin.

12. The electronic component of claim 1 wherein the top portion of the cap is sloped at an angle relative to the first semiconductor device.

13. The electronic component of claim 1 wherein the cap has a side and the side of the cap is coated with a conductive material such that the side of the cap is nontransparent to light generated by the first semiconductor device when the first semiconductor device is electrically active.

14. The electronic component of claim 1 wherein the cap has a side and the side of the cap is coated with a material such that the side of the cap is nontransparent to light.

15. An electronic component comprising:
a substrate;
a semiconductor device overlying the substrate;
a cap having a top portion and sidewalls, wherein the cap comprises a dielectric material, the sidewalls provide a cavity overlying the semiconductor device, and the top portion provides a lens overlying the semiconductor device; and
a ring overlying the substrate, the cap being coupled to the ring such that the cavity of the cap is adjustably positioned over the semiconductor device.

16. The electronic component of claim 15 wherein the ring has an alignment guide, the cap has a groove, and at least a portion of the alignment guide is within the groove of the cap.

17. The electronic component of claim 15 wherein the lens has a thickness of about 0.1 millimeters to 20 millimeters and is transparent to light.

18. The electronic component of claim 15 wherein the top portion of the cap provides a lens protector that extends above the lens.

19. The electronic component of claim 15 wherein the lens has an upper surface that is concave and a lower surface that is convex.

20. The electronic component of claim 15 wherein the cavity of the cap extends at least 0.25 millimeters above the semiconductor device.

21. The electronic component of claim 15 wherein the top portion of the cap is sloped at an angle relative to the semiconductor device.

22. An electronic component comprising:
a leadframe having a plurality of leads;
a semiconductor device electrically coupled to the plurality of leads;
a ring overlying the leadframe; and
a cap having a top portion that is transparent and sidewalls that provide a cavity, wherein cap is coupled to the ring such that the cavity of the cap is adjustably positioned overlying the semiconductor device so that when the semiconductor device is electrically active, light generated by the semiconductor device is in focus a distance over the top portion of the cap.

* * * * *